US006163215A

United States Patent [19]

Shibata et al.

[11] Patent Number: 6,163,215

[45] Date of Patent: Dec. 19, 2000

[54] VARIABLE GAIN AMPLIFIER

[75] Inventors: Kohei Shibata; Satoshi Ide, both of Kanagawa, Japan

[73] Assignee: Fujitsu Limited, Kawasaki, Japan

[21] Appl. No.: 09/296,513

[22] Filed: Apr. 22, 1999

[30] Foreign Application Priority Data

Dec. 8, 1998 [JP] Japan .................................. 10-348810

[51] Int. Cl.[7] ........................................................ H03F 3/45

[52] U.S. Cl. ............................................. 330/254; 327/359

[58] Field of Search ............................. 330/254; 327/359

[56] References Cited

U.S. PATENT DOCUMENTS

| | | | |
|---|---|---|---|
| 4,704,738 | 11/1987 | Graziadei et al. | 455/253 |
| 5,896,063 | 4/1999 | Marsh et al. | 330/254 |
| 5,949,285 | 9/1999 | Ando | 330/254 |
| 5,999,049 | 12/1999 | Katakura | 330/252 |

FOREIGN PATENT DOCUMENTS

| | | |
|---|---|---|
| 10126178 | 5/1998 | Japan . |

*Primary Examiner*—Robert Pascal
*Assistant Examiner*—Henry Choe
*Attorney, Agent, or Firm*—Helfgott & Karas, P.C.

[57] ABSTRACT

In a variable gain amplifier controlling a gain by using differential amplifiers with a gain control signal, a gain switchover differential amplifier or a bias circuit which composes a current mirror with the gain switchover differential amplifier is connected between a high and a low gain differential amplifier for the same bias current which are mutually connected to share load resistances for the same output polarity and a bias current source common to both of the differential amplifiers, to perform switchover operations of the high and the low differential amplifier by a gain control signal, and a current source which flows a fixed offset current through at least the low one of the high and the low differential amplifier is provided.

15 Claims, 15 Drawing Sheets

VARIABLE GAIN AMPLIFIER

BACKGROUND OF THE INVENTION

1. Field of the Invention

The present invention relates to a variable gain amplifier, and in particular to a variable gain amplifier controlling a gain with a differential amplifier by a gain control signal.

The variable gain amplifier is utilized in many devices using electric circuits regardless of technical fields. When an extension of an input dynamic range is intended for the sake of circuit designs, it is required to be used not only as a simple variable gain amplifier but also, for instance, as a linear amplifier for a small signal input, as a variable gain amplifier for a middle signal input or as an amplitude limiting amplifier for a large signal input.

2. Description of the Related Art

FIG. 14 shows an arrangement of a conventional variable gain amplifier. This variable gain amplifier is composed of two differential amplifiers Q1 and Q2 sharing load resistors R1 and R2, a differential amplifier Q3 to perform a gain switchover of the differential amplifiers Q1 and Q2, and a bias current source B1 to provide a bias current to the differential amplifiers Q1 and Q2 through the differential amplifier Q3.

In comparison under the same bias current amount, the differential amplifier Q1 provides a higher gain than the differential amplifier Q2. The drains of transistors M3 and M5 which respectively compose a high and a low gain differential amplifier Q1 and Q2 are mutually coupled and commonly connected to the load resistor R1. Similarly, the drains of transistors M4 and M6 are mutually coupled and commonly connected to the load resistor R2.

Also, the sources of the transistors M3 and M4 in the gain differential amplifier Q1 are mutually coupled and commonly connected to the drain of a transistor M1 which composes the gain switchover differential amplifier Q3. In the same way, the sources of the transistors M5 and M6 in the low gain differential amplifier Q2 are mutually coupled and commonly connected to the drain of a transistor M2 which composes the differential amplifier Q3.

Furthermore, the gates of the transistors M3 and M5 are commonly connected to a signal input terminal S1. Similarly, the gates of the transistors M4 and M6 are commonly connected to a signal input terminal S2. Junctions of the differential amplifiers Q1, Q2 and the load resistors R1, R2 are connected to output terminals O1 and O2, respectively.

In addition, the sources of the transistors M1 and M2 in the gain switchover differential amplifier Q3 are mutually coupled and commonly connected to the bias current source B1, the gate terminal of the transistor M1 is connected to a gain control signal input terminal C1, and the gate of the transistor M2 is connected to a gain control signal input terminal C2.

In such a variable gain amplifier, the ratio $(1-\alpha)$: $\alpha$ $[0\leqq\alpha\leqq1]$ of current amounts which flows through the high and the low gain differential amplifier Q1 and Q2 is controlled by varying the voltage of the gain control signal given from the signal input terminals C1 and C2 to the gates of the transistors M1 and M2 in the gain switchover differential amplifier Q3, so that the output gain is made variable by keeping constant a DC (direct current) amount which flows through the load resistors R1 and R2 without varying a DC level outputted to the output terminals O1 and O2 determined by a load resistance X the DC amount.

Namely, each small signal gain G of the CMOS differential amplifiers Q1 and Q2 where each load resistance of the load resistors R1 and R2 is R1 is expressed, by using a mutual conductance $g_m$, as $G=g_m\times R_l$. Since $g_m$ is proportional to the root of a bias current $I_s$ by the current source B1, $G=R_l\times kI_s^{0.5}$ is given where k is a coefficient depending on a size β of a transistor.

From this, a small signal gain $G_v$ is given by the following equation as a variable gain amplifier whose gain varies with the bias current ratio α, which is a value controlled by the input potential of the differential amplifier Q3, of the differential amplifiers Q1 and Q2 shown in FIG. 14:

$$G_v=R_l\{k_h[(1-\alpha)I_s]^{0.5}+k_l[\alpha I_s]^{0.5}\} \qquad \text{Eq. (1)}$$

where subscripts h and l indicate that they are attendant on the high and the low gain differential amplifier.

In Eq. (1), the first and the second term in the right member { } respectively indicate gain variations of the high and the low gain differential amplifier Q1 and Q2 for the current ratio α as shown by symbols ● and ▲ in FIG. 15. The characteristic of the small signal gain $G_v$ in the variable gain amplifier where both symbols are compounded is shown by a symbol ■ in FIG. 15.

It is seen from the gain characteristic shown in FIG. 15 that while α varies from 0, the small signal gain $G_v$ does not monotonously decrease but the gain once expands as shown by an enclosed part with a dotted line 100.

This is because the gain variations of resistance load type differential amplifiers Q1 and Q2 are not linear around 0 of the bias current ratio a where only the high gain differential amplifier Q1 operates, and the gain rises of the transistors M5 and M6 in the low gain differential amplifier Q2 are larger than the gain falls of the transistors M3 and M4 in the high gain differential amplifier Q1.

Accordingly, the gain variation is not monotonous for the variation of the bias current ratio α, i.e. the variation of the gain control signal input, so that when the gain fall is required, the gain will rise, resulting in a possibility of malfunction.

On the other hand, the manufacture of transistors with a lower cost by using a big diameter wafer has become popular by improved minute machining techniques for the transistors in recent years, while an available power source voltage have a tendency to decrease as the transistors are more minutely machined.

However, in the above-mentioned variable gain amplifier, the high or the low gain differential amplifier, the gain switchover differential amplifier and the bias current source are connected in series across current source terminals. Therefore, it is disadvantageous that as the number of transistors connected in cascade increases, a sufficient operation voltage is not secured and a DC design becomes difficult.

SUMMARY OF THE INVENTION

It is accordingly an object of the present invention to provide a variable gain amplifier which suppresses the occurrence of a malfunction and enables a low voltage operation by making a monotonic gain variation for the variation of a gain control signal.

To achieve the above-mentioned object, a variable gain amplifier according to the present invention comprises a high and a low gain differential amplifier for the same bias current which are mutually connected to share load resistors for the same output polarity, a bias current source common to both of the differential amplifiers, a gain switchover differential amplifier which is connected between the high and the low gain differential amplifier and the bias current source to perform switchover operations of the high and the low gain differential amplifier by a gain control signal, and a current source which flows a fixed offset current through at least the low one of the high and the low gain differential amplifier.

Namely, in the present invention, a current source is provided for flowing a fixed offset current through at least a low one of a high and a low gain differential amplifier. This characteristic will be described as follows:

A small signal gain $G_V$ of the variable gain amplifier is given by the following equation by continuously flowing a fixed offset current $I_b$ beforehand through the low gain differential amplifier from the current source:

$$G_V = R_l \times \{k_h[(1-\alpha)I_s]^{0.5} + k_l[\alpha I_s + I_b]^{0.5}\} \quad \text{Eq. (2)}$$

FIG. 2 shows a variation characteristic of the small signal gain $G_V$ for a current ratio $\alpha$ of the variable gain amplifier expressed by Eq. (2). A sharp gain variation of the low gain differential amplifier around 0 of the bias current ratio $\alpha$ can be avoided by flowing a fixed offset current $I_b$ through the low gain differential amplifier. The gain variation of the low gain differential amplifier (shown by the symbol ▲) can be kept equal to or less than that of the high gain differential amplifier (shown by the symbol ●), so that the gain variation of the variable gain amplifier (shown by the symbol ■) can be made monotonic.

On the other hand, in order to deal with a decreasing tendency of a variable current source voltage, the number of transistors connected in cascade can be decreased.

Therefore, the present invention provides a variable gain amplifier comprising a high and a low gain differential amplifier which are mutually connected to share load resistances for the same output polarity, a first and a second bias circuit respectively connected to the high and the low gain differential amplifier, and a gain switchover differential amplifier which composes a current mirror with the first and the second bias circuit and performs switchover operations of the high and the low gain differential amplifier by providing a fixed current from a current source for the bias circuits by a gain control signal.

Namely, the high and the low gain differential amplifier are separated from the gain switchover differential amplifier, and in return the first and the second bias circuit are connected to the high and the low gain differential amplifier. The gain switchover differential amplifier composes the current mirror for the first and the second bias circuit.

This arrangement makes the first and the second bias circuit respectively reproduce or copy a high and a low gain control current generated in the gain switchover differential amplifier, and makes the reproduced gain control currents respectively for the bias current of the high and the low gain differential amplifier. Accordingly, it becomes possible to achieve the same operation as the above-mentioned variable gain amplifier, and further to achieve a lower voltage operation with the decreased number of transistors connected between ground potential and a power source.

Also in this case, a current source which flows a fixed offset current through at least the low gain differential amplifier may be provided.

In addition, a current source which flows a fixed offset current from the gain switchover differential amplifier through the above-mentioned second bias circuit may be provided instead of the current source which flows a fixed offset current through the low gain differential amplifier.

Moreover, a resistor may be inserted between sources of at least one of the high and the low gain differential amplifier, and bias circuits which compose a current mirror with the gain switchover differential amplifier and are connected to both ends of the resistor. In this way, a parameter which provides the above-mentioned small signal gain can include a source resistance.

In addition, a cascode transistor may be inserted between the load resistors and the differential amplifiers to provide the variable gain amplifier whose signal band is improved by preventing parasitic capacities of transistors in the differential amplifier from being directly observed from the load resistors.

Moreover, the above-mentioned current source may be the one which generates a fixed current varying to suppress a small signal gain variation of the high and the low gain differential amplifier for a variation of conditions including a circumferential condition and a manufacturing process condition.

This current source may be composed of a first transistor pair having different elements for suppressing the variation of the conditions and a current mirror which has a suppressing resistor at one of the transistor pair, a second transistor pair having a current mirror whose composition is opposite to that of the current mirror in the first transistor pair and flowing an equal amount of current through the first transistor pair, means for taking out the equal amount of current from at least one of both transistor pairs, and bias circuits for each of the transistor pairs.

Also, in addition to the above-mentioned variable gain amplifier, a variable gain amplifier as a feed forward control type which is suitable for a burst data reception may be obtained by further providing a peak and a bottom detector which respectively detect a peak and a bottom value of an input signal, a voltage divider which divides outputs of both detectors to generate a threshold signal, means which input the input and the threshold signal to the high and the low gain differential amplifier, and a gain control signal generation circuit which generates the gain control signal controlled by the peak and the bottom value.

The gain control signal generation circuit may include a level shift circuit which shifts either the peak or the bottom value, and a differential amplifier which generates the gain control signal amplified with a fixed gain by inputting one of the peak and the bottom value which is not shifted in level and the output signal of the level shift circuit.

In addition, at least two stages of the variable gain amplifier to form a multi-stage variable gain amplifier may be provided in which each of the variable gain amplifiers shares the peak and the bottom detector, means are further provided which input the output signal of the variable gain amplifier in a former stage to the high and the low gain differential amplifier of the variable gain amplifier in a latter stage, and an input/output characteristic of each gain control signal generation circuit is set in order that a gain switchover characteristic substantially has an inverse proportion to an input amplitude. This arrangement makes it possible to maintain an output amplitude fixed with a middle to large amplitude.

It is to be noted that a cascode transistor may be connected to a drain side of the above-mentioned current mirror, and a collector and an emitter may be substituted for the drain and the source.

BRIEF DESCRIPTION OF THE DRAWINGS

Throughout the figures, the same reference numerals indicate identical or corresponding portions.

DESCRIPTION OF THE EMBODIMENTS

Hereinafter, embodiments of a variable gain amplifier according to the present invention will be described referring to attached drawings.

Figure 1:
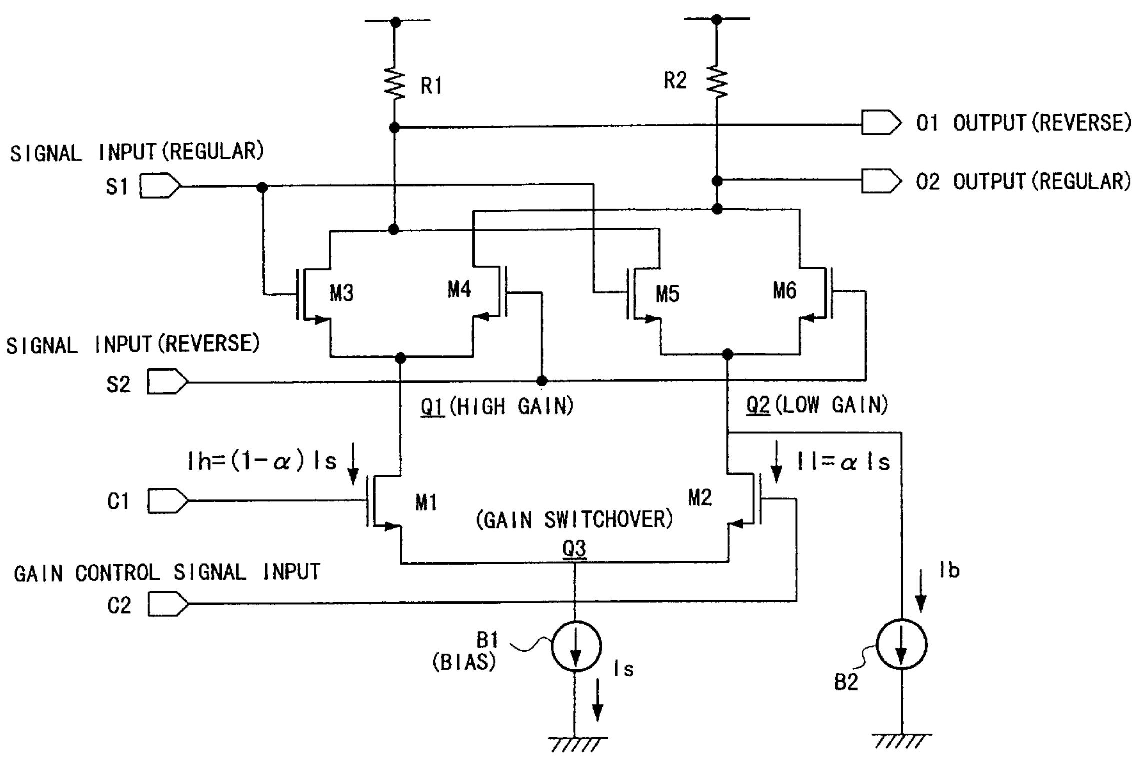
FIG. 1 is a circuit diagram showing an embodiment (1) of a variable gain amplifier according to the present invention.
Figure 14:
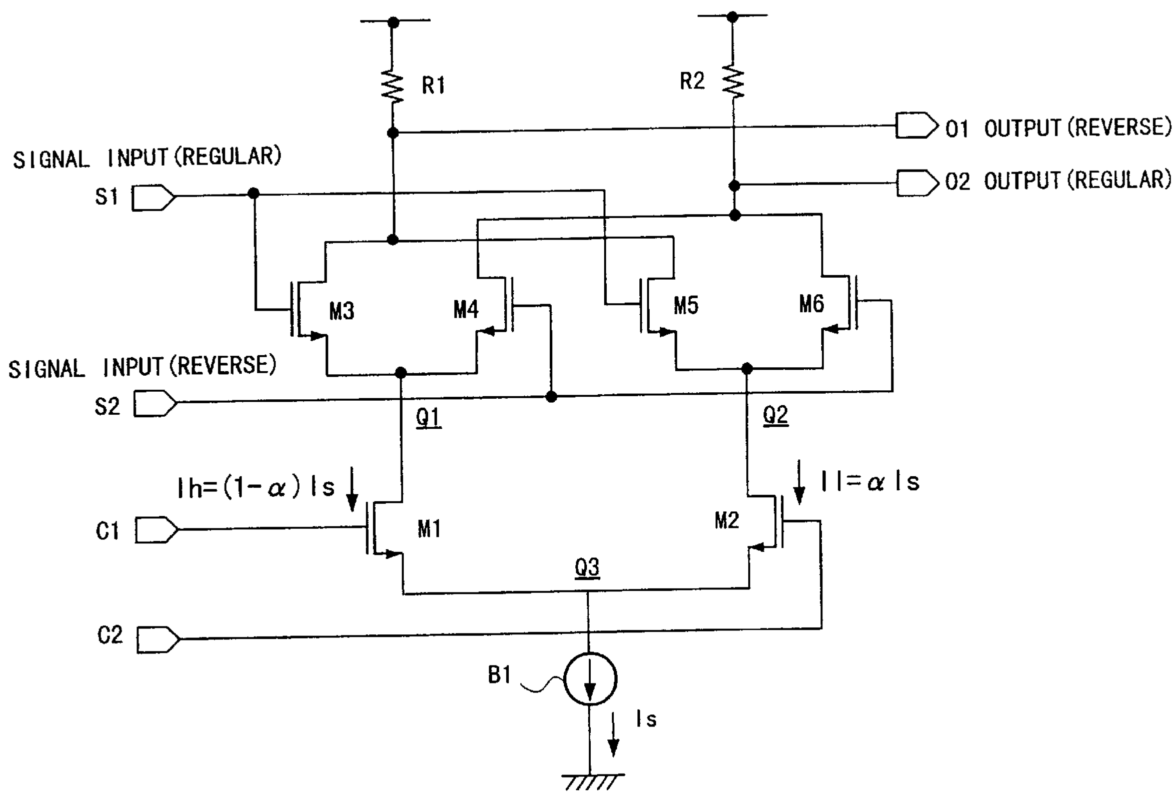
FIG. 14 is a circuit diagram showing a conventional variable gain amplifier.

FIG. 1 shows an embodiment (1) of a variable gain amplifier according to the present invention. In this embodiment, as compared with the prior art shown in FIG. 14, a fixed current source B2 is provided at a source coupling portion between transistors M5 and M6 in order that an offset fixed current $I_b$ flows through the side of the transistors M5 and M6 in a low gain differential amplifier Q2.

Figure 2:
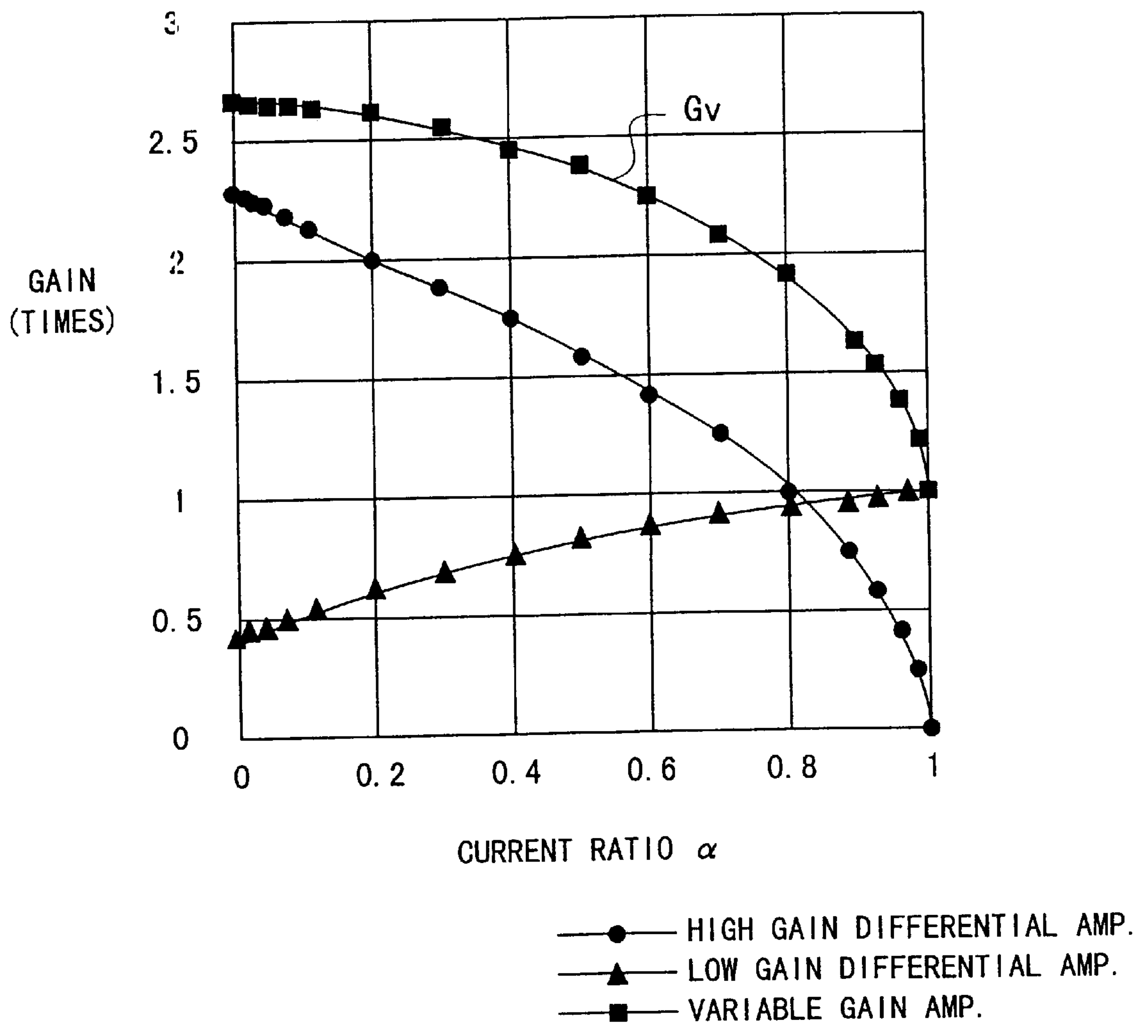
FIG. 2 is a graph showing a gain variation characteristic in an embodiment (1) of a variable gain amplifier according to the present invention.
Figure 15:
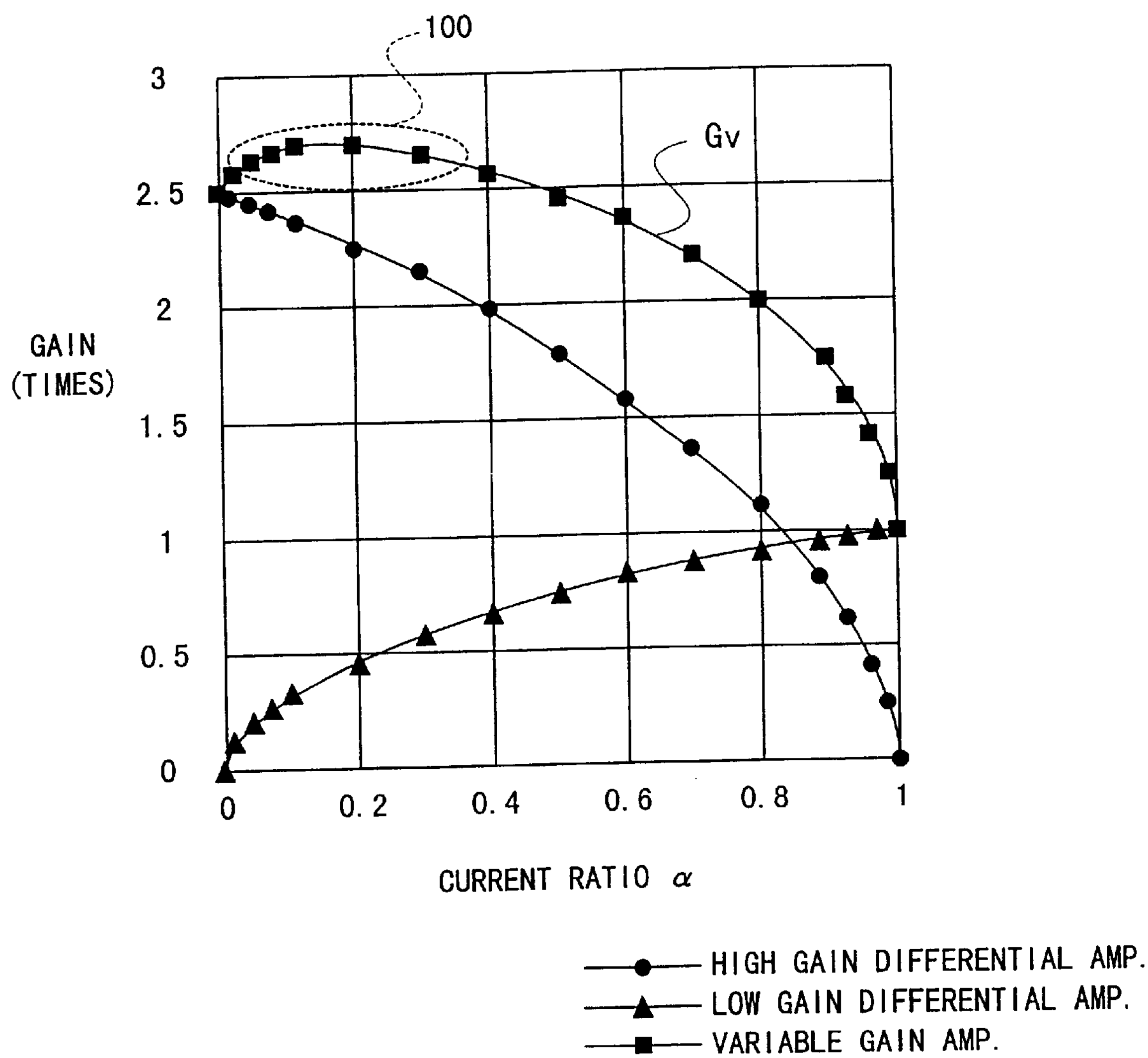
FIG. 15 is a graph showing a gain variation of a conventional variable gain amplifier.

A current switchover of transistors M1 and M2 in a gain control differential amplifier Q3 in this arrangement prevents the transistors M5 and M6 in the low gain differential amplifier Q2 from rapidly rising as shown in FIG. 15, suppresses the gain variation of the low differential amplifier Q2 equal to or lower than that of a high gain differential amplifier Q1 as shown in FIG. 2, and monotones the gain variation of the variable gain amplifier in its entirety.

As the amount of the offset current $I_b$ continuously flowed through the low gain differential amplifier Q2 depends on a coefficient $k_l$ determined by the size (β) of the transistors M5 and M6 in the low gain differential amplifier Q2, it has only to be properly determined so that the gain variation may be calm according to a design. It is also possible to provide the current source B2 not only in the low gain differential amplifier Q2 but also in the high gain differential amplifier Q1 to flow a fixed current.

In addition, supposing that a power source voltage is $V_{dd}$, an output DC level $V_{dc\text{-}out}$ of the variable gain amplifier is given by the following equations:

N-type differential amplifier:

$$V_{dc\text{-}out}=V_{dd}-0.5\times R_l\times(I_s+I_b) \quad \text{Eq. (3)}$$

P-type differential amplifier:

$$V_{dc\text{-}out}=0.5\times R_l\times(I_s+I_b) \quad \text{Eq. (4)}$$

Therefore, in order to avoid the variation of a DC level caused by the addition of $I_b$, a bias current $I_s$ has only to be changed by a bias current source B1 so that $I_s+I_b$ may have a value of $I_s$ before being added with $I_b$.

Figure 3:
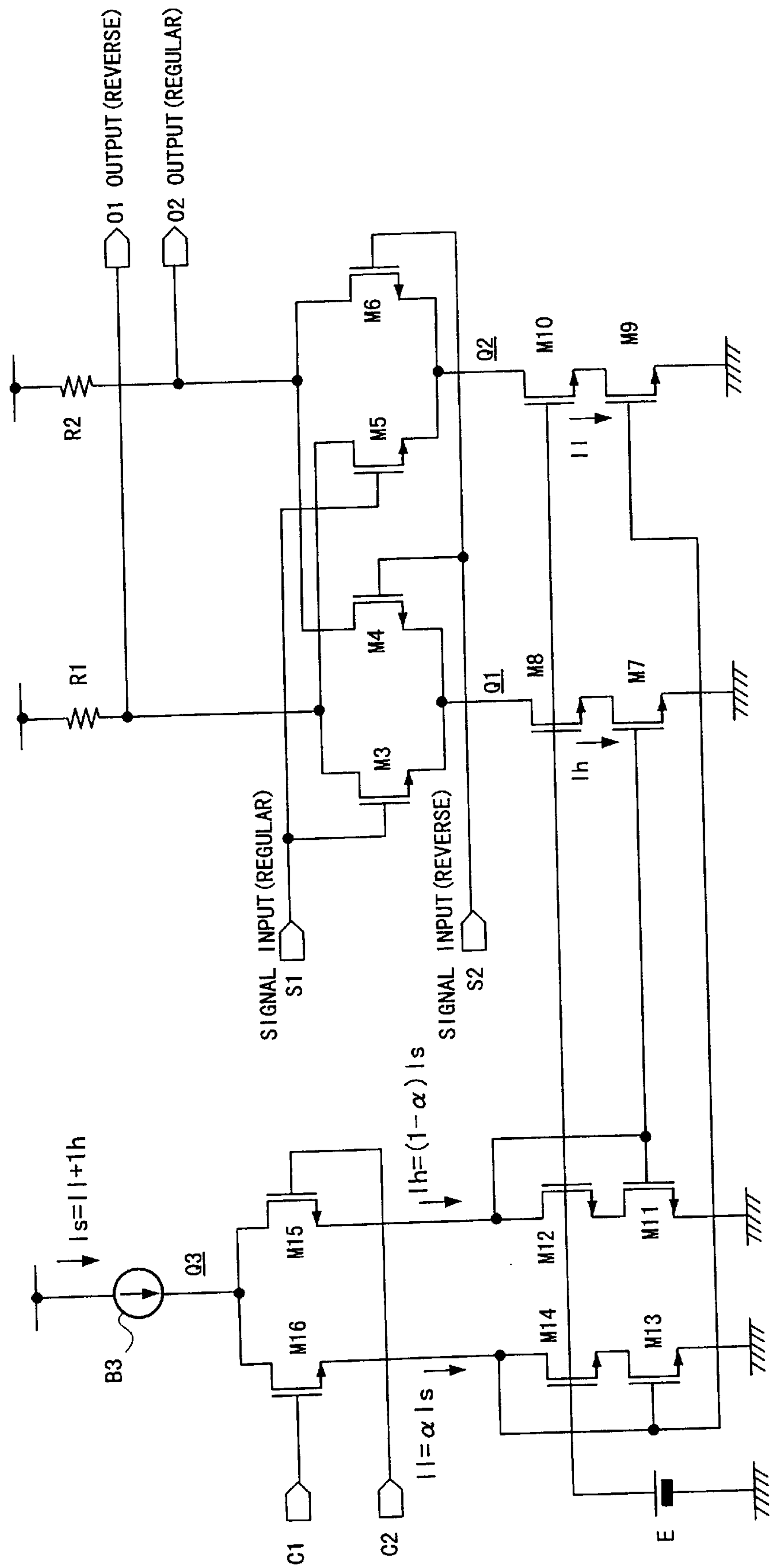
FIG. 3 is a circuit diagram showing an embodiment (2) of a variable gain amplifier according to the present invention.

FIG. 3 shows an embodiment (2) of a variable gain amplifier according to the present invention. In this embodiment, the differential amplifiers Q1 and Q2 which provide a gain are separated from the differential amplifier Q3 which controls the gain. A transistor M7 is connected to the high gain differential amplifier Q1, and a cascode transistor M8 is connected to the transistor M7. Likewise, a transistor M9 is connected to the low gain differential amplifier Q2 and a cascode transistor M10 is connected to the transistor M9.

Transistors M11 and M12 are connected to the transistors M7 and M8, and transistors M13 and M14 are connected to the transistors M9 and M10, respectively to compose a current mirror. It is to be noted that the transistors M12 and M14 compose a cascode transistor for the transistors M11 and M13 like the transistors M8 and M10.

A transistor M15 of the gain switchover differential amplifier Q3 is further connected in series with the transistors M11 and M12, and a transistor M16 is connected in series with the transistors M13 and M14. Drains of these transistors M15 and M16 are commonly connected to a bias current source B3.

It is to be noted that a DC bias is supplied to each gate terminal of the cascode transistors M8, M10, M12, and M14 from a DC source E, and in each of the current mirrors, the variation of drain potential in the transistors M7, M9, M11, and M13 which mutually give and take current is suppressed, thereby improving the operation accuracy of the current mirrors.

Especially in a CMOS transistor, a resistance between a source and the drain is low, i.e. about several MΩ depending on a manufacturing process, and the current which flows between the source and the drain is easy to change as the drain potential changes. Accordingly, a common gate transistor is inserted into a current source shown by a current source's symbol in the embodiment.

However, when the resistance between the source and the drain can be set high in the manufacturing process (when the current variation between the source and drain as the drain potential changes is in a level within an allowable range determined by the specification or the like) it is not required to insert the common gate transistor into the current mirror.

In this way, only the transistors M7 and M8 are provided on the side of the high gain differential amplifier Q1 in the embodiment (2). Likewise, the transistors M9 and M10 are provided in the low gain differential amplifier Q2. Therefore, it is possible to have a margin voltage for a single stage of the bias current source (the current source B1 in FIG. 1).

Figure 4:
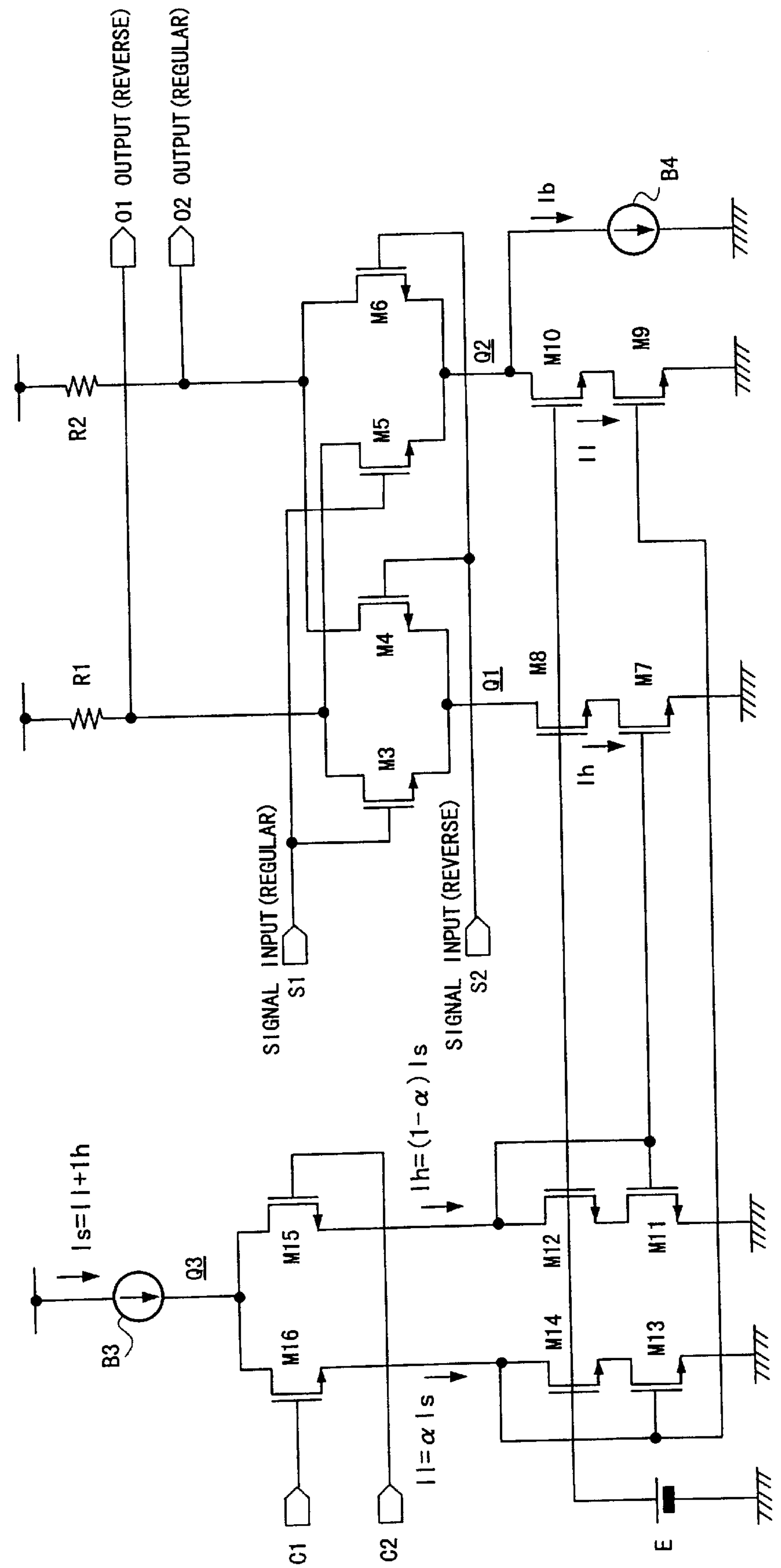
FIG. 4 is a circuit diagram showing an embodiment (3) of a variable gain amplifier according to the present invention.

FIG. 4 shows an embodiment (3) of a variable gain amplifier according to the present invention. In this embodiment, as compared with the embodiment (2) shown in FIG. 3, a fixed current source B4 is connected to the source coupling portion between the transistors M5 and M6 in order that the fixed current $I_b$ flows through the low gain differential amplifier Q2 like the embodiment (1) shown in FIG. 2.

This prevents the gain of the low gain differential amplifier Q2 from rapidly rising by the current switchover operation of the gain switchover differential amplifier Q3 in the embodiment (2) (see FIG. 2).

Namely in the embodiment (3), the transistors M15 and M16 of the gain switchover differential amplifier Q3 operate based on a gain control signal given from signal input terminals C1 and C2. As shown in FIG. 4, only a component $Ih=(1-\alpha)Is$ of the current from the bias current source B3 is flowed through the transistor M15, and the current $Il=\alpha Is$ is flowed through the transistor M16.

In the presence of a current mirror, the same current Ih is flowed from the transistors M11 and M12 to the transistors M7 and M8, while the same current $Il=\alpha Is$ is flowed from the transistors M13 and M14 to the transistors M9 and M10. Hence, the similar operation applies to the case where the gain switchover differential amplifier Q3 is directly connected to the high and the low gain differential amplifier Q1 and Q2.

Figure 6:
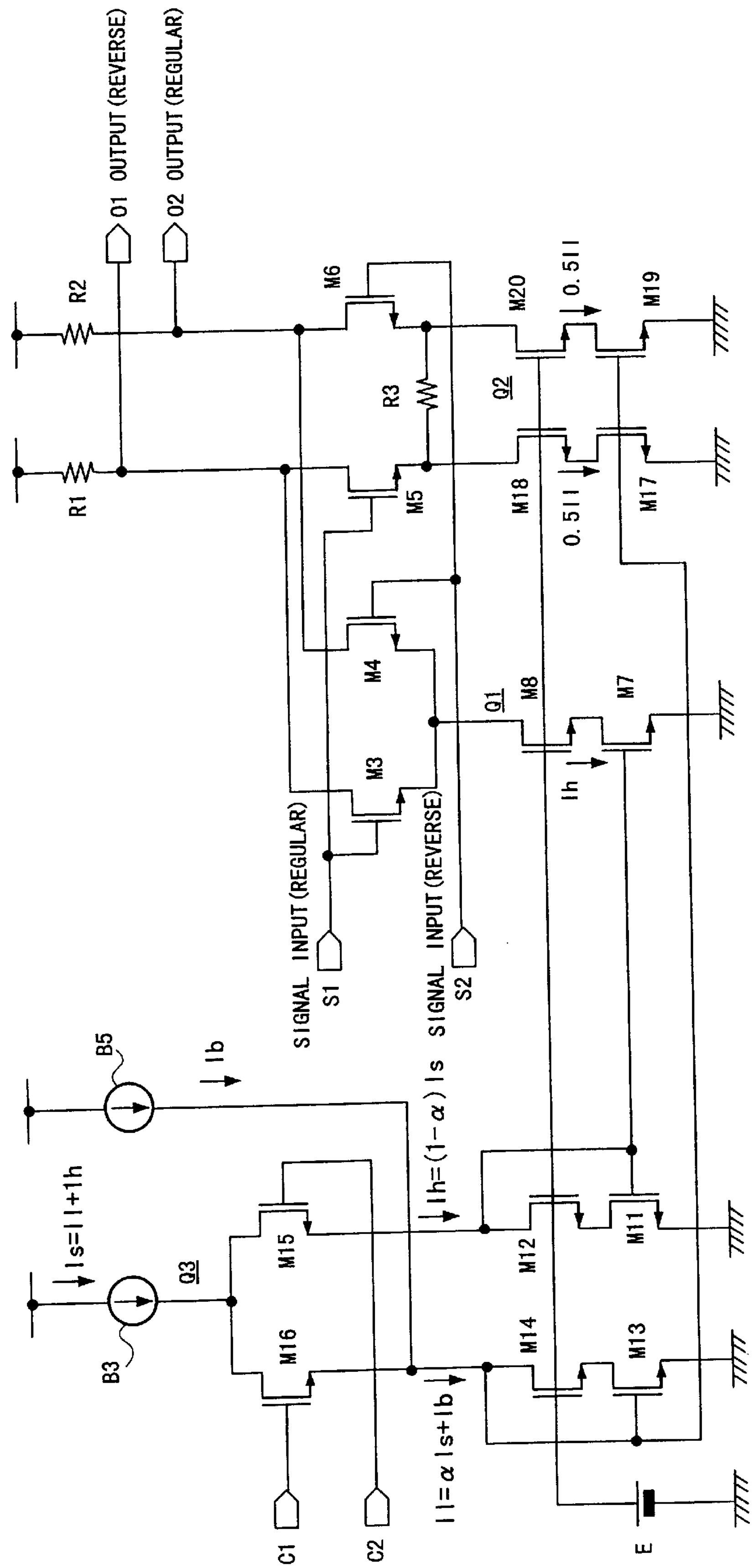
FIG. 6 is a circuit diagram showing an embodiment (5) of a variable gain amplifier according to the present invention.

FIG. 6 shows an embodiment (4) of a variable gain amplifier according to the present invention. In this embodiment, a current source B5 is connected to a source terminal of the transistor M16 in the gain switchover differential amplifier Q3, instead of the current source B4 in the embodiment (3) shown in FIG. 4.

Namely in this embodiment, in order to flow the fixed current $I_b$ through the transistors M5 and M6 in the low gain differential amplifier Q2 the fixed current source B6 is connected to the source of the transistor M16 which controls the bias current $I_b$ through the transistors M9, M10, M13, and M14 which compose the current mirrors with each other. The current switchover operation of the gain switchover differential amplifier Q3 prevents the gain of the low gain differential amplifier Q2 from rapidly rising like the above-mentioned embodiments.

Figure 5:
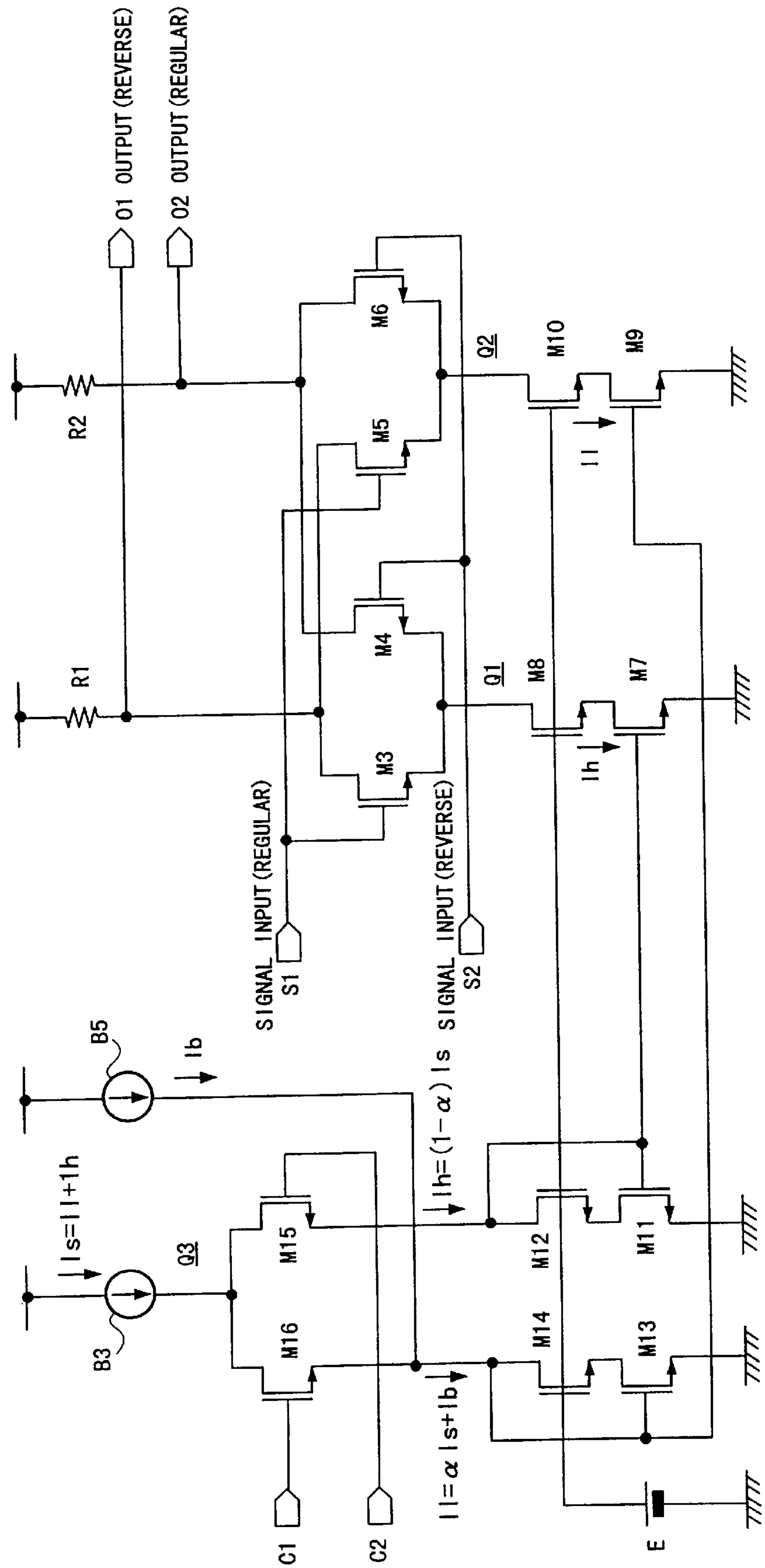
FIG. 5 is a circuit diagram showing an embodiment (4) of a variable gain amplifier according to the present invention.

FIG. 6 shows an embodiment (5) of a variable gain amplifier according to the present invention. In this embodiment, as compared with the embodiment (4) shown in FIG. 5, a source resistor R3 is inserted between the sources of the transistors M5 and M6 in the low gain differential amplifier Q2, and transistors M17, M18 and M19, M20 are respectively connected to both ends of the source resistor R3. It is to be noted that in this embodiment the transistors M18 and M20 compose cascode transistors for the transistors M17 and M19, respectively.

It is known that a small signal gain $G_s$ of the differential amplifier Q2 associated with the source resistance used in such an embodiment can be approximated by the following equation using a load resistance value $R_l$, and a source resistance value $R_s$:

$$G_s - g_m \times R_l/(1+g_m \times R_s) \quad \text{Eq. (5)}$$

From this Eq. (5), it is found that when gm is large enough or $R_s$ is large enough, the small signal gain of the differential amplifier Q2 associated with the source resistance is almost determined by the ratio $R_l/R_s$ of the resistance $R_l$ of load resistors R1 and R2 and the source resistor R3.

Namely, if the low gain differential amplifier Q2 is realized by a normal arrangement without a source resistor such as the high gain differential amplifier Q1, the gain is decreased only by the size of the differential amplifier. As a result, the current density between the source and the drain of the differential amplifier is enhanced, and much more potential between the source and the drain is required, which is disadvantageous for a lower voltage circuit. However, the arrangement of this embodiment is advantageous in that the low gain differential amplifier Q2 can be realized without enhancing the current density unnecessarily because a large resistance can be adopted for the source resistor R3.

Since $g_m$ is proportional to the root of the bias current in the Eq. (5) in the low gain differential amplifier Q3 using the source resistor R3, the rise of the gain $G_s$ accompanied by the increase of the bias current becomes more rapid than that of a normal differential amplifier, so that it is required to flow much more fixed bias current from the current source B5 through the low gain differential amplifier Q2.

It is to be noted that the above-mentioned embodiments (1)–(3) can be applied to the arrangement in this embodiment.

Figure 7:
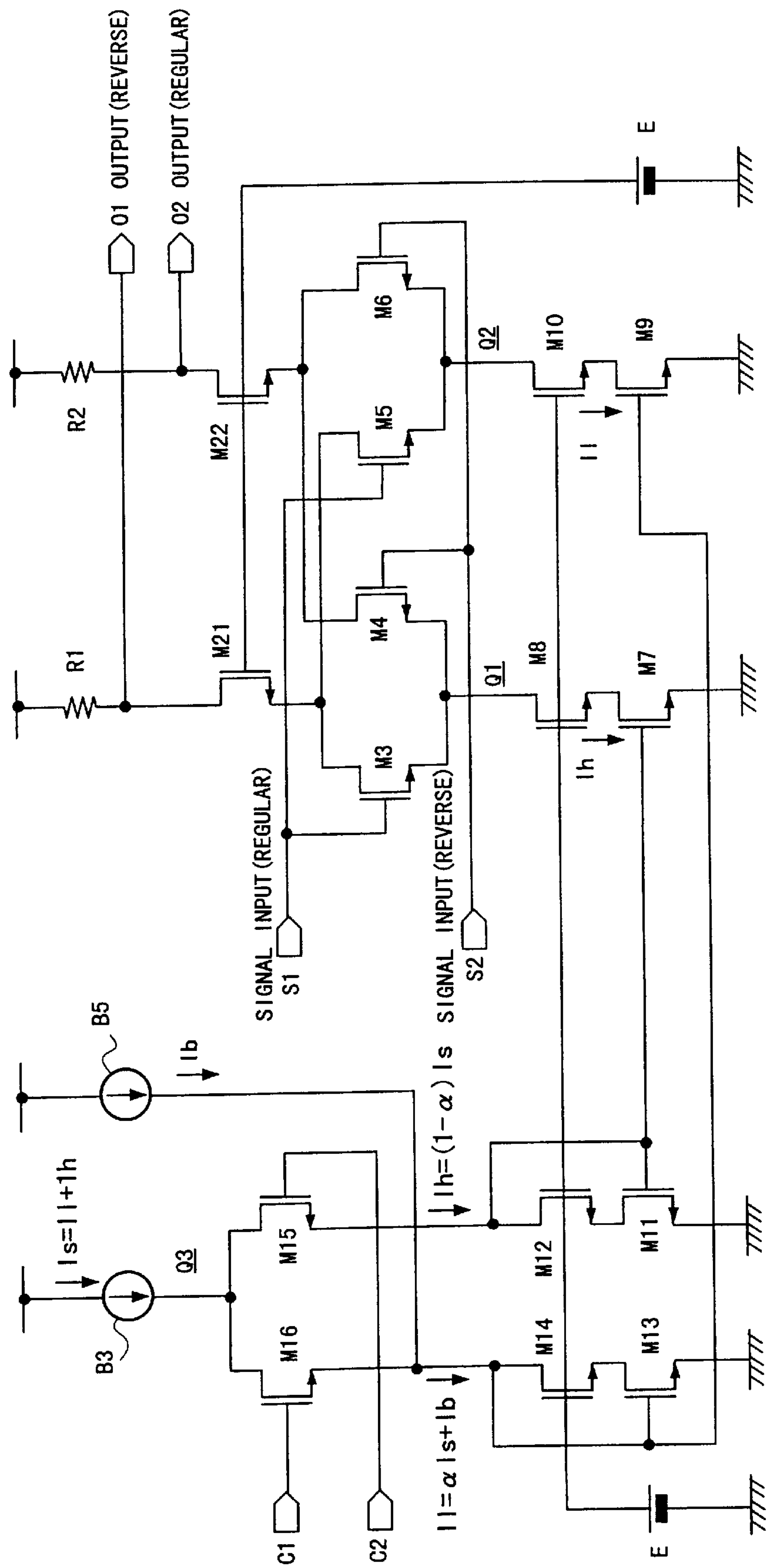
FIG. 7 is a circuit diagram showing an embodiment (6) of a variable gain amplifier according to the present invention.

FIG. 7 shows an embodiment (6) of a variable gain amplifier according to the present invention. In this embodiment, as compared with the embodiment (4) shown in FIG. 5, a common gate transistor M21 is connected between the drain coupling portion of a transistor M3 in the high gain differential amplifier Q1 and the transistor M5 in the low gain differential amplifier Q2 and the load resistor R1, a common gate transistor M22 is connected between the drain coupling portion of the transistors M4 and M6 and the load resistor R2 in the same way, and the bias current source E is connected to the gates of the transistors M21 and M22.

This arrangement improves a signal band since the transistor M21 functions as a cascode transistor in order that the parasitic capacities of the transistors M3 and M5 are not directly observed from the load resistor R1, and the transistor M22 functions as a cascode transistor in the same way for the transistors M4 and M6.

It is to be noted that the above-mentioned embodiments (1)–(3) can be applied to the arrangement in this embodiment.

Figure 8:
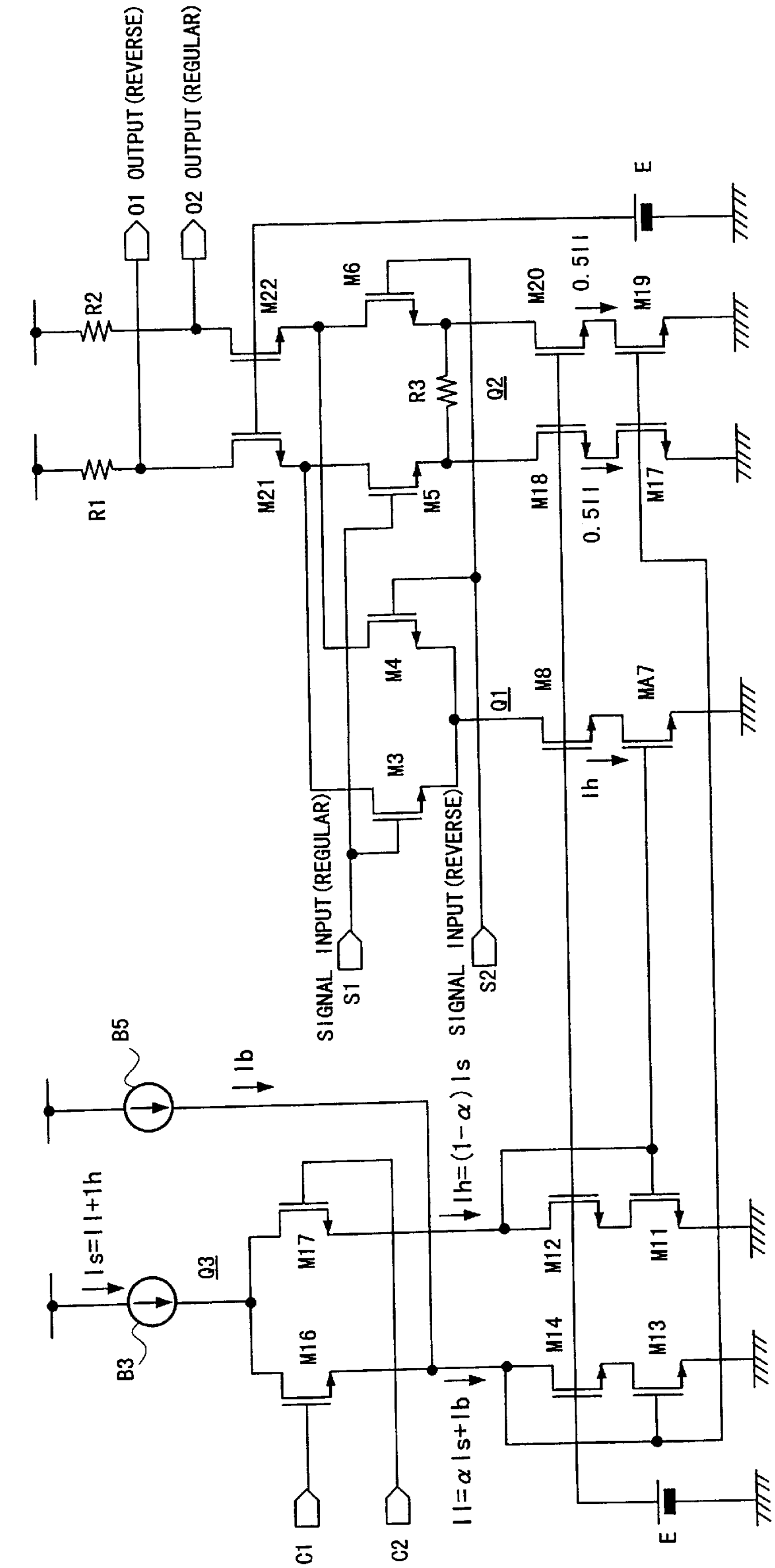
FIG. 8 is a circuit diagram showing an embodiment (7) of a variable gain amplifier according to the present invention.

FIG. 8 shows an embodiment (7) of a variable gain amplifier according to the present invention. In this embodiment, the source resistor R3 is inserted between the sources of the transistors M5 and M6 in the low gain differential amplifier Q2 in the embodiment (6) shown in FIG. 7 like the embodiment (5) shown in FIG. 6. The transistors M17, M18 and transistors M19, M20 are respectively connected to both ends of the source resistor R3 like the embodiment (5).

If a large resistance of the source resistor R3 is adopted like the embodiment (5) in FIG. 6 in addition to improving the signal band by the embodiment (6) shown in FIG. 7, this arrangement makes it possible to realize the low gain differential amplifier Q2 without enhancing the current density unnecessarily.

Figure 9:
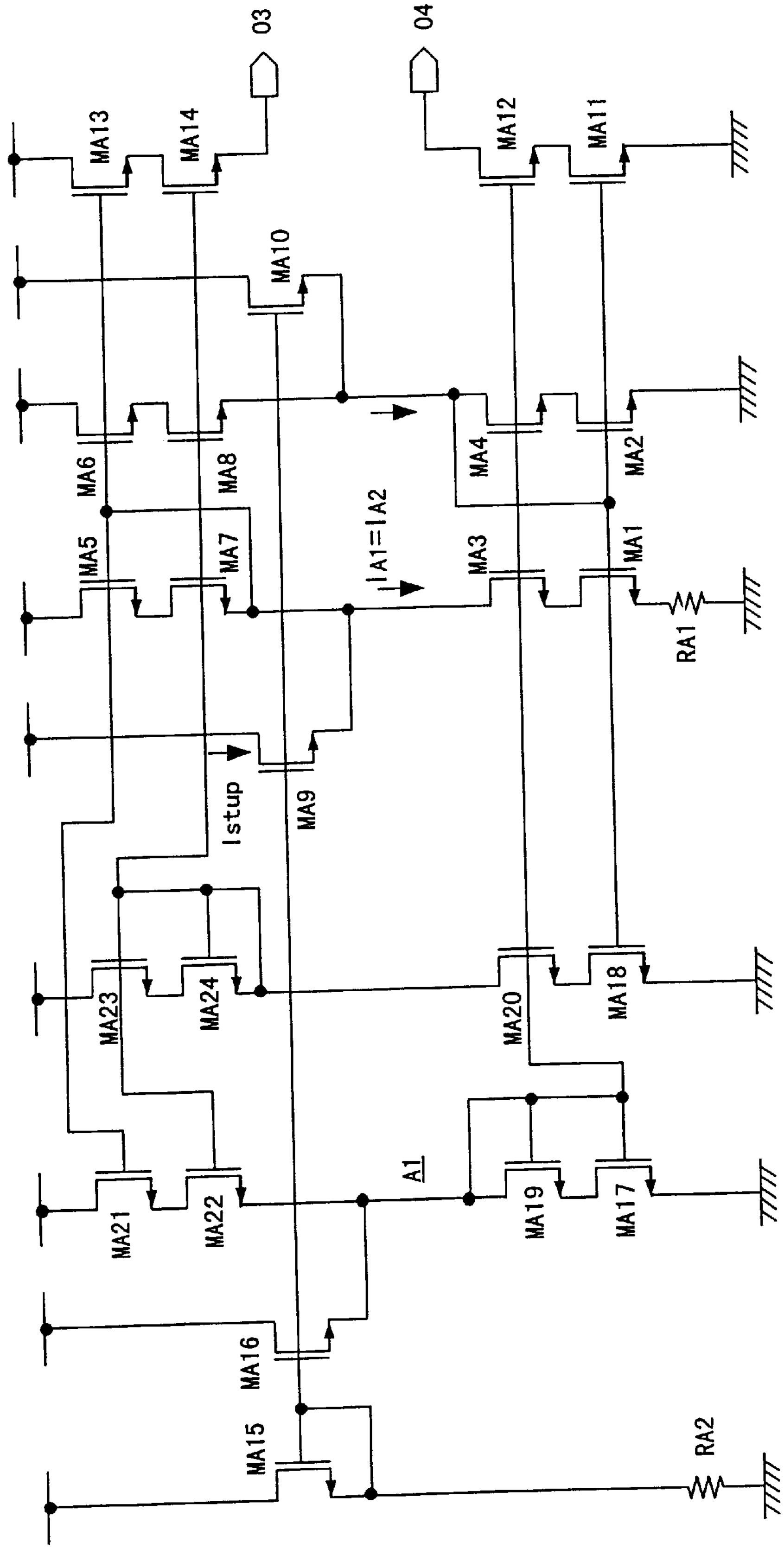
FIG. 9 is a circuit diagram showing an embodiment of a gain variation suppressing current source used in each embodiment of a variable gain amplifier according to the present invention.

FIG. 9 shows an embodiment of each current source used in the above-mentioned embodiments (1)–(7). Namely, this current source composes a bias circuit which suppresses a gain variation under a variation of condition such as temperature, and the manufacturing process to improve a gain controllability.

In this current source, as means for flowing an equal amount of current IB1=IB2 through two transistors MA1 and MA2 whose gate widths (or emitter areas) for suppressing the condition variation are different, a current mirror is composed of the suppressing (compensating) transistors MA1 and MA2, and a suppressing resistor RA1 is connected to the source of the transistor MA1.

Transistors MA5 and MA6 having a current mirror of the opposite composition to the transistors MA1 and MA2 are provided, the transistor MA1 is connected to the transistor MA5, and the transistor MA2 is connected to the transistor MA6. It is to be noted that transistors MA3, MA4 and MA7, MA8 respectively compose cascode transistors for the transistors MA1, MA2 and MA5, MA6.

Namely, it is known that a small signal gain G of an amplifier having the differential amplifier of a resistance load type is expressed by the following equation:

$$G=R\times\sqrt{\beta}\sqrt{I_s} \quad \text{Eq. (6)}$$

[R: load resistance, β: gain coefficient of MOS-FET, Is: bias current value]

[$\beta=\mu\cdot C_{OX}\cdot W/L$ (μ:electron mobility, COX: gate oxide film capacity, W: gate width, L: gate length)]

In view of an integrated circuit in the manufacturing process having a resistance element, the load resistance R and the gain coefficient β change under a variation of circumstances and manufacturing process as shown by the following equations:

$$R=R_{typ}(1\pm\Delta_r) \quad \text{Eq. (7)}$$

$$\beta=\beta_{typ}(1\pm\Delta_B) \quad \text{Eq. (8)}$$

Rtyp and βtyp indicate design values in a circumstance condition which is most frequently used and in a manufacturing process condition (typical condition) which is most frequently achieved. Δr and ΔB indicate variation amounts when the values are out of the circumstance and manufacturing condition.

It is to be noted that upon a circuit design, Δr and ΔB are preliminarily given to each manufacturing process used from a used temperature range, manufacturing yield, and the like according to a design specification. In addition, there is a manufacturing process where Δr and ΔB have a correlation for a temperature variation, while being generally thought to vary with being independent of the condition variation.

Accordingly, the small signal gain G of the differential amplifier of the resistance load type shown by the Eq. (6) is given by the following equation in consideration of the condition variation:

$$G=R_{typ}\times\sqrt{}_{typ}\times\sqrt{\phantom{x}}I_s\times(1\pm\Delta_r)\times(1\pm\Delta_B)^{0.5} \quad \text{Eq. (9)}$$

In Eq. (9), suppressing the variation of the small signal gain G can require the current value Is of the bias current source to vary in proportion to $1/R^2$ and 1/β to cancel the variation of R and β. In FIG. 9, the suppressing transistor MA2 has a gate whose width is "n" times as wide as that of the suppressing transistor MA1, otherwise both being the same. At this time the currents $I_{A1}$ and $I_{A2}$ which respectively flow through the transistors MA1 and MA2 are approximately expressed as the following equations:

$$I_{A1}=(\beta/2)\times(Vgs_{A1}-Vt)^2 \quad \text{Eq. (10)}$$

$$I_{A2}=(N\beta/2)\times(Vgs_{A2}-Vt)^2 \quad \text{Eq. (11)}$$

[$Vgs_{A1}$, $VgS_{A2}$: voltage between the gate and source of MA1 and M A2,

Vt: threshold value of CMOS transistor]

In FIG. 9, since the currents IA1 and IA2 are made equal by a current mirror arrangement, and the potential difference of $Vgs_A$ and $VgS_{A2}$ is applied to both ends of the suppressing resistor RA1 (resistance r), the following equation can be obtained:

$$\begin{aligned} Vgs_{31}-Vgs_{32} &= r\times I_{AI} \\ &= \sqrt{(2I_{AI}/\beta)}-\sqrt{\{2I_{A2}/(N\beta)\}} \end{aligned} \quad \text{Eq. (12)}$$

Accordingly, a current $I_g$ taken out of an output terminal O4 is expressed with a constant k1 for the calculation, a variation component of the resistance r of a resistor r4, and a variation component of the gain coefficient β as given by the following equation:

$$\begin{aligned} I_g = I_{AI} = I_{A2} &= \left((2/(r^2\beta))\left(1-1/\sqrt{N}\right)^2\right. \\ &= k_1 / \left\{r_{typ}^2(1\pm\Delta r)^2\times\beta_{typ}(1\pm\Delta B)\right\} \end{aligned} \quad \text{Eq. (13)}$$

Accordingly, if this is substituted for the Eq. (9), the small signal gain G is expressed by the following equation:

$$\begin{aligned} G &= R\times\sqrt{\beta}\times\sqrt{I_g} \\ &= G_{typ}\ (=\text{fixed}) \end{aligned} \quad \text{Eq. (14)}$$

$$\left[G_{typ}=R_{typ}\times\sqrt{\beta_{typ}}\times\sqrt{I_s}=\text{fixed}\right]$$

Namely, it is found that the small signal gain G is kept constant.

For the above-mentioned transistors MA1–MA8, a bias circuit A1 for the common gate transistor is provided. Transistors MA17, MA19, MA18 (to which a gate bias is given in common with the transistors MA1 and MA2), and MA20 compose a current mirror, and provide a gate bias for the transistors MA3 and MA4. In addition, transistors MA21 (to which a gate bias is given in common with the transistors MA5 and MA6), MA22, MA23, and MA24 compose a current mirror, and provide a gate bias for the transistors MA7 and MA8.

It is to be noted that transistors MA15, MA16 and a resistor RA2 serve to supply the transistors MA17 and MA19 in the bias circuit A1 with a start-up current, and that the start-up function of the transistors MA1, MA3 and the transistors MA2, MA4 is performed through start-up transistors MA9 and MA10.

Finally, a gain variation suppressing current is outputted from the transistors MA2, MA4 and transistors MA11, MA12 which compose another current mirror to the output terminal O4. Alternatively, it is possible to output the same gain variation suppressing current from the transistors MA5, MA7 and transistors MA13, MA14 which compose another current mirror through an output terminal O3.

Thus, the current flowing through the transistors MA1, MA2, or the transistors MA5, MA6 is taken out by the current mirror, and is used for the bias current source in the above-mentioned embodiments, whereby it is possible to realize a variable gain amplifier which suppresses the gain variation due to the condition variation such as temperature and manufacturing process. Particularly, it becomes important when a feed forward control is performed.

Figure 10:
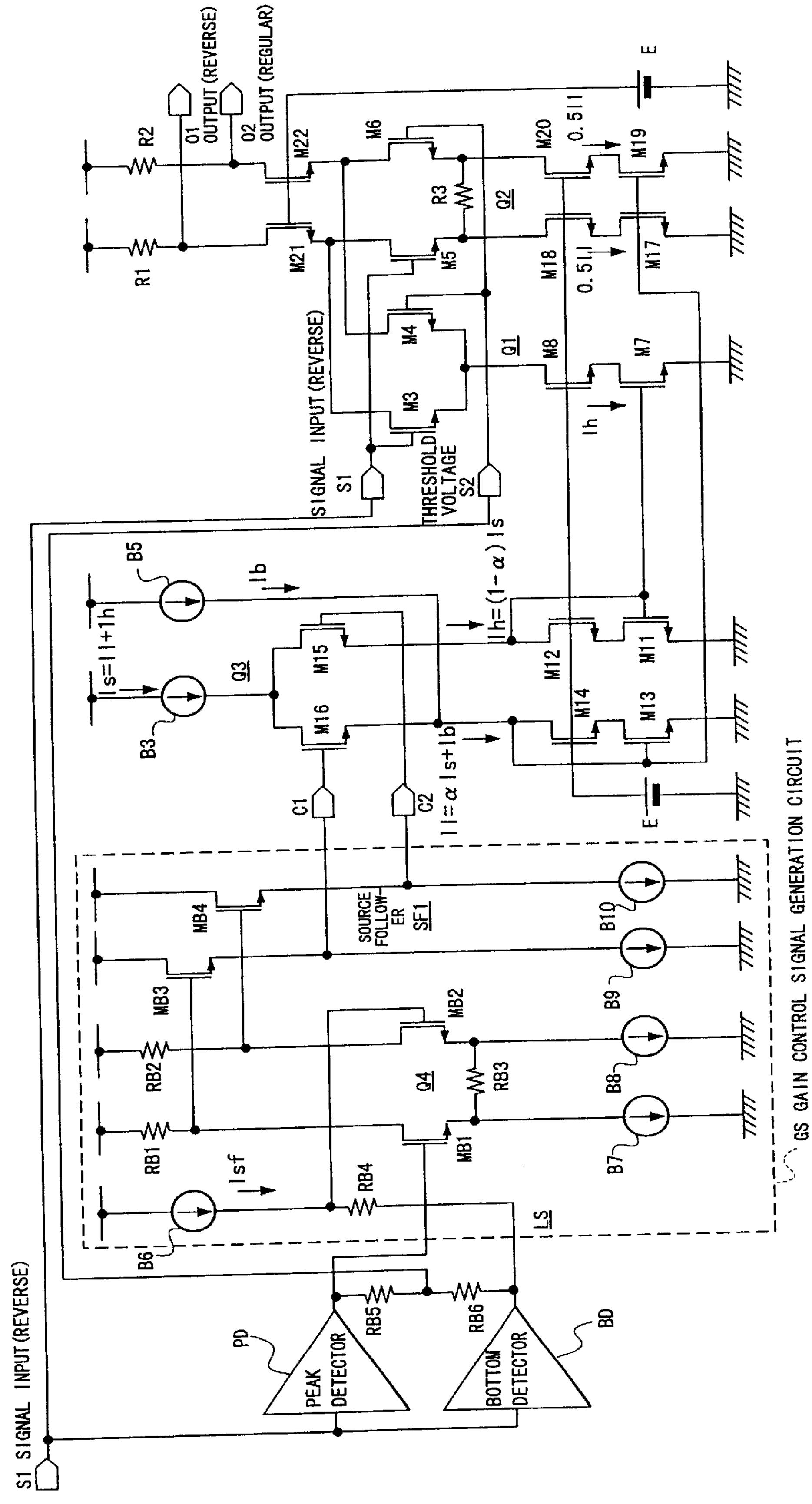
FIG. 10 is a circuit diagram showing an embodiment (8) of a variable gain amplifier according to the present invention.

FIG. 10 shows an embodiment (8) of a variable gain amplifier according to the present invention. In this embodiment, a gain control signal generation circuit GS which provides the gain control signal is connected to the input terminals C1 and C2 in the embodiment (7) shown in FIG. 8, and furthermore the input voltage of the gain control signal generation circuit GS inputs a peak and a bottom value respectively detected by a peak detector PD and a bottom detector BD which commonly receive an input signal.

In addition, as to the input signal to the high and the low gain differential amplifier Q1 and Q2, it is given to a terminal S1 as it is on one hand, while on the other hand the signal from the junction of potential resistors RB5 and RB6 connected between the peak detector PD and the bottom detector BD is given to an input terminal S2 as a threshold value.

The gain control signal generation circuit GS inputs the peak value detected by the peak detector PD to the gate of a transistor MB1 which composes a differential amplifier Q4, and inputs the bottom value detected by the bottom detector BD to the gate of the transistor MB2 which composes the differential amplifier Q4 through a resistor RB4.

In this differential amplifier Q4, a source resistor RB3 is connected between the sources of transistors MB1, MB2, and current sources B7, B8 are connected to both ends of the source resistance RB3. Also, load resistors RB1 and RB2 are respectively connected to the drains of the transistors MB1 and MB2. From the respective junctions thereof, gate input voltages are given to transistors MB3 and MB4 which compose a voltage dropping source follower SF1. From the respective junctions of the transistors MB3, MB4 and power sources B9, B10, gate input voltages are given to the gain control signal input terminals C1 and C2 of the gain switchover differential amplifier Q3.

It is to be noted that a bias current source B6 is connected to the junction of the resistor RB4 and the gate of the transistor MB2, and a current Isf is continuously flowed into the bottom detector BD to compose a level shift circuit LS which fluctuates the gate potential (bottom value) of the transistor MB2.

Figure 11B:
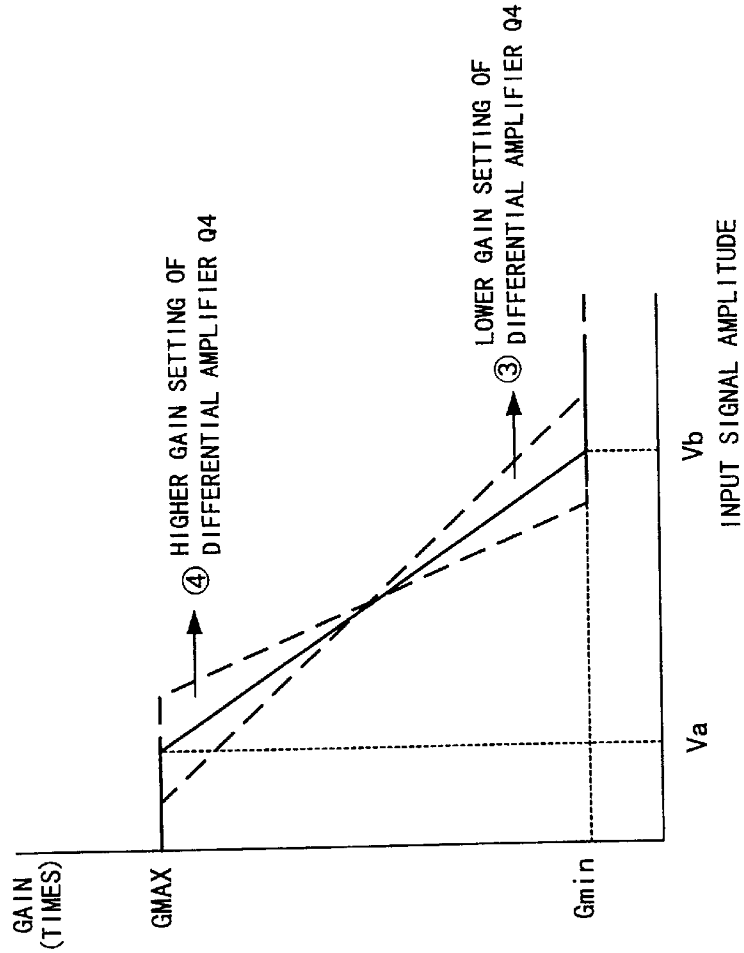
FIGS. 11A and 11B are graphs showing a relationship between a design parameter and a gain switchover characteristic of a gain control signal generation circuit in an embodiment (8) of a variable gain amplifier according to the present invention.
Figure 11A:
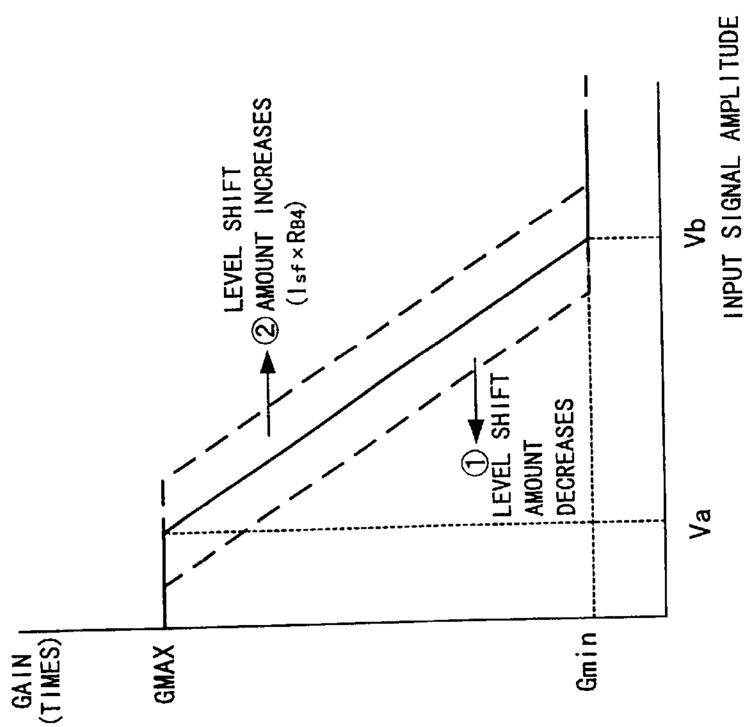

Hereinafter, the operation of this embodiment will be described mainly on the operation of the gain control signal generation circuit GS referring to FIG. 11.

Firstly, in order to achieve the gain switchover characteristic designated by a greatest gain $G_{MAX}$, a smallest gain $G_{min}$ a gain switchover start potential difference $V_a$, a gain switchover end potential difference $V_b$, as shown in FIG. 11, design parameters can be determined by the following procedure:

i) Set a DC level→Determine $R_1$, $I_s$, $I_b$ from Eq. (3) or (4);
ii) Set α=1 in Eq. (2) from the smallest gain $G_{min}$, and determine $k_1$ and the size (β) of the low gain differential amplifier Q2 corresponding to $k_1$;
iii) Set α=0 in Eq. (2) from the largest gain $G_{MAX}$, and determine $k_h$ and the size (β) of the high gain differential amplifier Q1 corresponding to $k_h$;
iv) Determine a required gain of the differential amplifier Q4 in the gain control signal generation circuit GS from the inclination of a gain switchover $(G_{min}-G_{MAX})/(V_b-V_a)$ (see FIG. 11B ③, ④; and
v) Determine a shift amount of the level shift circuit LS from the gain switchover start potential difference $V_a$ (or $V_b$) with the values of the current Isf or the resistor RB4 (see FIG. 11A ①, ②).

Accordingly, as an input signal level becomes larger, the input signal level of the differential amplifier Q4 is decreased through the level shift circuit LS, so that the output signal level is given to the differential amplifier Q3 as a small gain control signal. On the contrary, as the input signal level becomes smaller, the input signal level of the differential amplifier Q4 is increased through the level shift circuit LS, so that the output signal level is given to the differential amplifier Q3 as a large gain control signal. The gain switchover operation is performed for the differential amplifiers Q1 and Q2 according to those gain control signals.

It is to be noted that while this embodiment illustrates the level shift circuit LS utilizing a voltage drop caused by the resistor RB4 and the current Isf, a level shift circuit utilizing a threshold value potential of a diode can be substituted. However, since the shift amount is determined by the threshold voltage of the diode, the arrangement formed of the resistor RB4 and the current source B6 like this embodiment can be more freely designed.

Moreover, the reason why the differential amplifier Q4 comprises a source resistance type is that the freedom degree on a gain design is high. The arrangement of the gain control signal generation circuit GS illustrates an example when an input signal amplitude swings to the ground side. When the input signal amplitude swings to a current source side, an arrangement in which the level shift operation is performed for the output of the peak detector PD can be used. It becomes possible to deal with a burst data reception by providing a reset function for the peak detector PD and the bottom detector BD.

Figure 12:
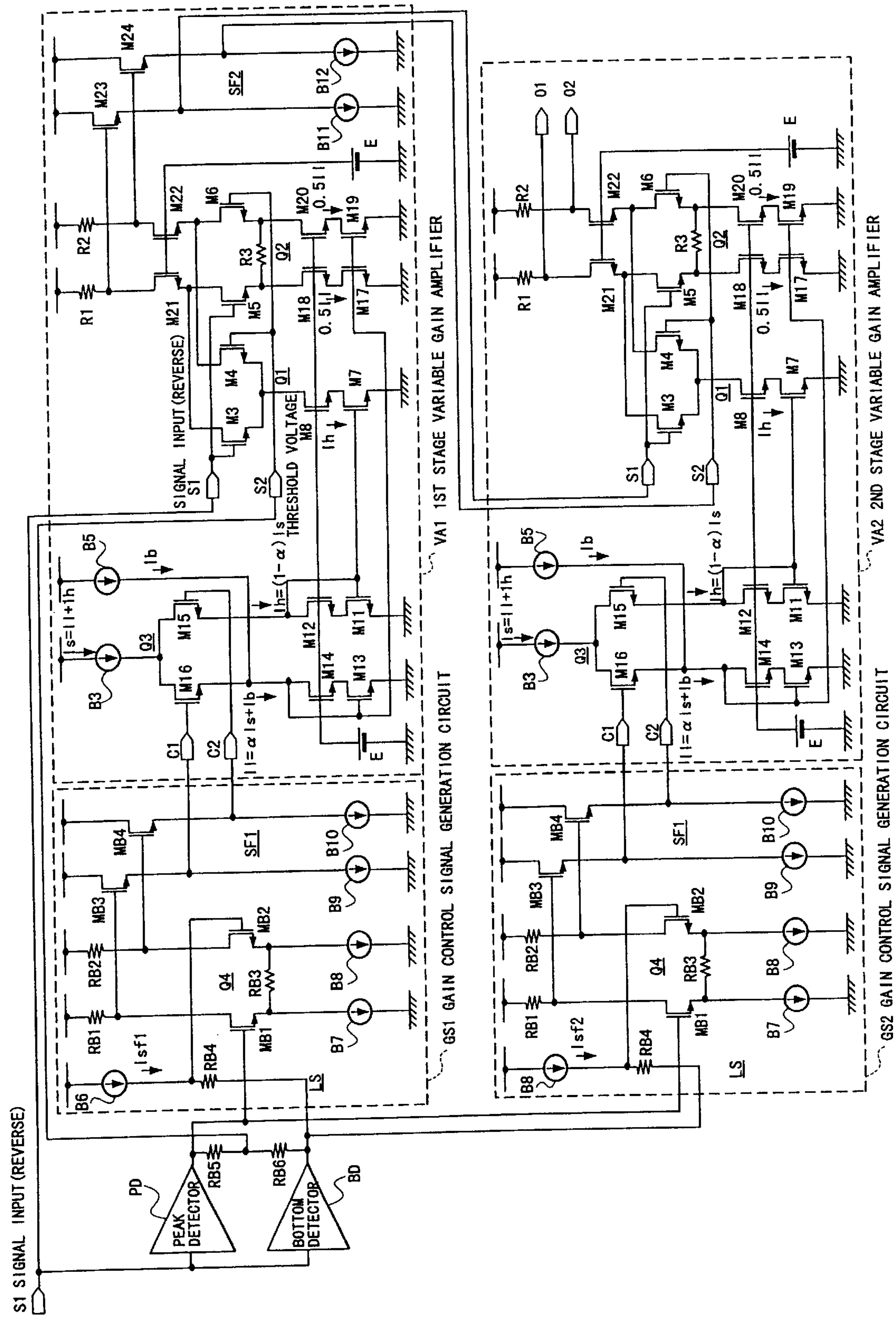
FIG. 12 is a circuit diagram showing an embodiment (9) of a variable gain amplifier according to the present invention.

FIG. 12 shows an embodiment (9) of a variable gain amplifier according to the present invention. In this embodiment, two stages of the gain amplifier in the embodiment (8) shown in FIG. 10 are connected, which includes two gain control signal generation circuits GS1, GS2, a first stage variable amplifier VA1, and a second stage variable amplifier VA2. The input signal of the gain control signal generation circuits GS1 and GS2 shares the output signal of the peak detector PD and the bottom detector BD.

In addition, a threshold signal from the junction of the input signal and voltage dividing resistors RB5 and RB6 is used for the signal input of the first stage variable amplifier VA1, and the output signal of the first stage variable amplifier VA1 is given to the signal input terminals S1 and S2 of the second stage variable amplifier VA2 from transistors M23 and M24 which compose a voltage dropping source follower SF2 and from the junction of current sources B12 and B13.

When such a multi-stage variable gain amplifier is used in a feed forward control, in order to keep an output amplitude constant with a middle to large amplitude signal, the gain switchover characteristic of the variable gain amplifier is only required to be in inverse proportion to an input amplitude as expressed by the following equation:

$$\text{input amplitude}\times\text{amplifier gain}=\text{output amplitude (=constant)} \quad \text{Eq. (15)}$$

Figure 13A:
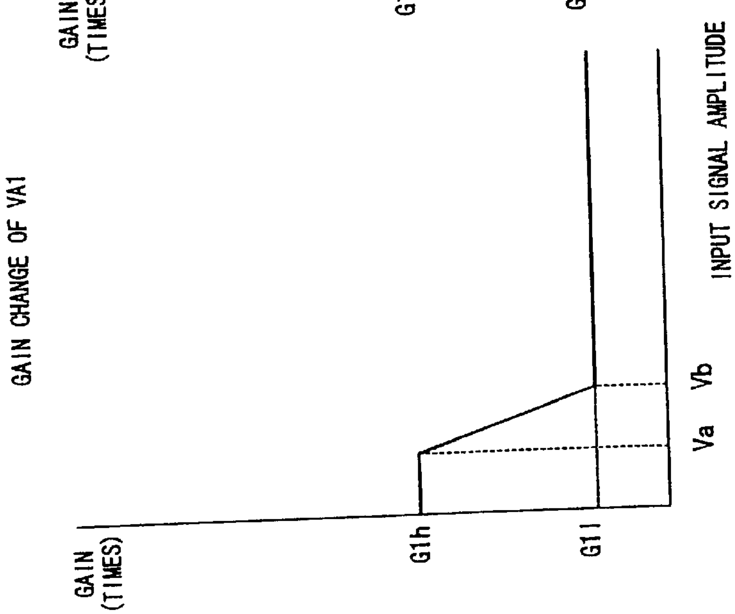
FIGS. 13A–13C are graphs showing a gain variation in an embodiment (9) of a variable gain amplifier according to the present invention.
Figure 13B:
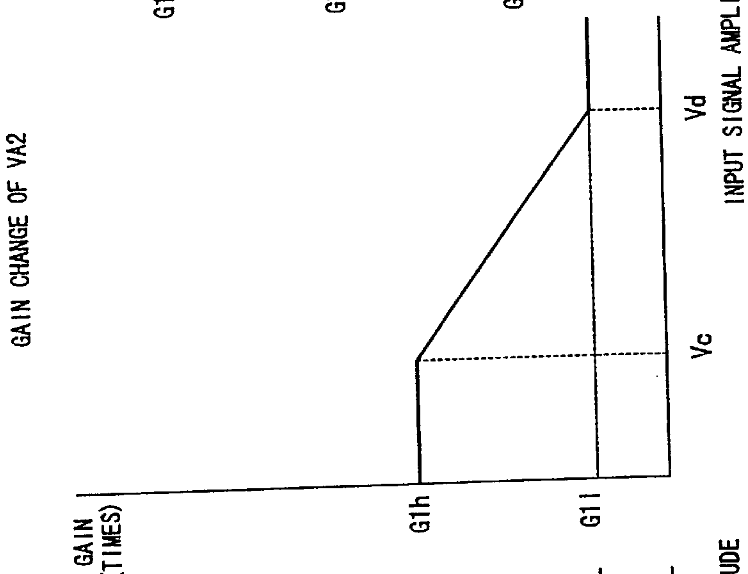
Figure 13C:
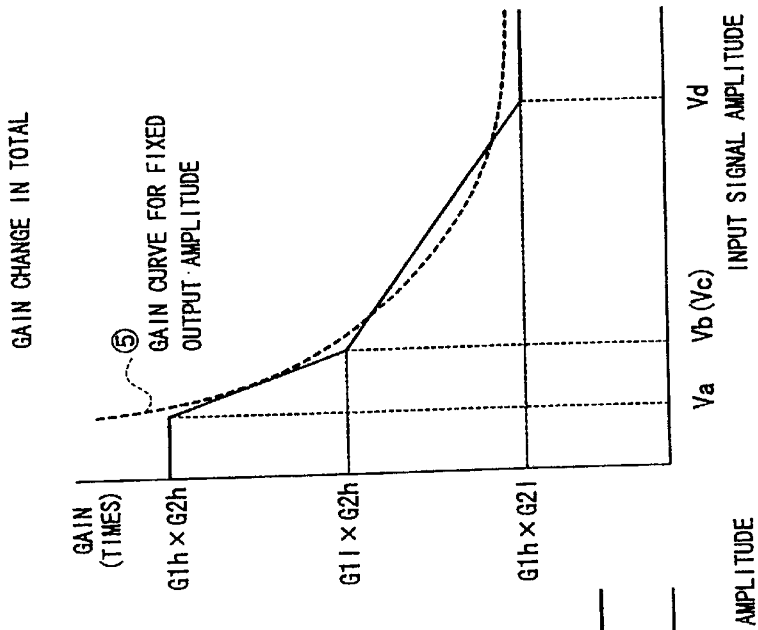

Therefore, two variable gain amplifiers VA1 and VA2 are provided in order to have the gain switchover characteristic as shown in FIGS. 13A and 13B, and the arrangement can be used which obtains the gain switchover characteristic almost in inverse proportion to an input in total as shown in FIG. 13C.

It is not always necessary that a gain switchover end input signal amplitude $V_b$ of the first stage amplifier accurately accords with a gain switchover start input signal amplitude $V_c$ of the second amplifier. Also, the gain shown in FIG. 13B is one for a differential signal input.

It is to be noted that while in the above-mentioned embodiments, the arrangements using a CMOS transistor have been described, the arrangement with a bipolar transistor can be also applied. Moreover, while an N-type amplifier has been described, a P-type arrangement can be also applied. In the embodiment (9) it is also possible to have a combination of N-type in the first stage and P-type in the second stage or a combination of P-type in the first stage and N-type in the second stage.

As described above, a variable gain amplifier according to the present invention is arranged such that a gain switchover differential amplifier or a bias circuit which composes a current mirror with the gain switchover differential amplifier is connected between a high and a low gain differential amplifier for the same bias current which are mutually connected to share load resistances for the same output polarity and a bias current source common to both of the differential amplifiers, to perform switchover operations of the high and the low differential amplifier by a gain control signal, and a current source which flows a fixed offset current through at least the low one of the high and the low differential amplifier is provided. Therefore, it becomes possible to utilize a variable gain amplifier in a low voltage operation without malfunctions, as a linear amplifier with a small signal, as a variable gain amplifier with a middle signal, and as a amplitude limiting amplifier with a large signal, resulting in an extension of an input dynamic range.

What we claim is:

1. A variable gain amplifier comprising;

a high and a low gain differential amplifier utilizing the same bias current which are mutually connected to share load resistors for the same output polarity, a bias current source common to both of the differential amplifiers, a gain switchover differential amplifier which is connected between the high and the low gain differential amplifier and the bias current source to perform switchover operations of the high and the low gain differential amplifier by a gain control signal, and a current source which flows a fixed offset current through at least the low one of the high and the low gain differential amplifier.

2. A variable gain amplifier comprising;

a high and a low gain differential amplifier which are mutually connected to share load resistances for the same output polarity, a first and a second bias circuit respectively connected to the high and the low gain differential amplifier, and a gain switchover differential amplifier which composes a current mirror with the first and the second bias circuit and performs switchover operations of the high and the low gain differential amplifier by providing a fixed current from a current source for the bias circuits by a gain control signal.

3. A variable gain amplifier as claimed in claim 2, further comprising a current source which flows a fixed offset current through at least the low one of the high and the low gain differential amplifier.

4. A variable gain amplifier as claimed in claim 2, further comprising a current source which flows a fixed offset current from a side of the gain switchover differential amplifier through the second bias circuit.

5. A variable gain amplifier as claimed in claim 4, further comprising a resistor inserted between sources of at least one of the high and the low gain differential amplifier, and bias circuits which compose a current mirror with the gain switchover differential amplifier and are connected to both ends of the resistor.

6. A variable gain amplifier as claimed in claim 4, further comprising a cascode transistor inserted between the load resistances and the differential amplifiers.

7. A variable gain amplifier as claimed in claim 5, further comprising a cascode transistor inserted between the load resistances and the differential amplifiers.

8. A variable gain amplifier as claimed in claim 1 wherein the current source further comprising means for generating a fixed current which varies to suppress a small signal gain variation of the high and the low gain differential amplifier for a variation of conditions including a circumstance condition and a manufacturing process condition.

9. A variable gain amplifier as claimed in claim 8 wherein the current source comprises a first transistor pair having different elements for suppressing the variation of the conditions and a current mirror which has a suppressing resistor at one of the transistor pair, a second transistor pair having a current mirror whose composition is opposite to that of the current mirror in the first transistor pair and flowing an equal amount of current through the first transistor pair, means for taking out the equal amount of current from at least one of both transistor pairs, and bias circuits for each of the transistor pairs.

10. A variable gain amplifier as claimed in claim 1, further comprising, as a feed forward control type, a peak and a bottom detector which respectively detect a peak and a bottom value of an input signal, a voltage divider which divides outputs of both detectors to generate a threshold signal, means which input the input and the threshold signal to the high and the low gain differential amplifier, and a gain control signal generation circuit which generates the gain control signal controlled by the peak and the bottom value.

11. A variable gain amplifier as claimed in claim 10 wherein at least two stages of the variable gain amplifier to form a multi-stage variable gain amplifier, each of the variable gain amplifiers shares the peak and the bottom detector, means are further provided which input the output signal of the variable gain amplifier in a former stage to the high and the low gain differential amplifier of the variable gain amplifier in a latter stage, and an input/output characteristic of each gain control signal generation circuit is set in order that a gain switchover characteristic substantially has an inverse proportion to an input amplitude.

12. A variable gain amplifier as claimed in claim 10 wherein the gain control signal generation circuit includes a level shift circuit which shifts either the peak or the bottom value, and a differential amplifier which generates the gain control signal amplified with a fixed gain by inputting one of the peak and the bottom value which is not shifted in level and the output signal of the level shift circuit.

13. A variable gain amplifier as claimed in claim 11 wherein the gain control signal generation circuit includes a level shift circuit which shifts either the peak or the bottom value, and a differential amplifier which generates the gain control signal amplified with a fixed gain by inputting one of the peak and the bottom value which is not shifted in level and the output signal of the level shift circuit.

14. A variable gain amplifier as claimed in claim 2, further comprising a cascode transistor connected to a drain side of the current mirror.

15. A variable gain amplifier as claimed in claim 5, further comprising a resistor inserted between emitters of at least one of the high and the low gain differential amplifier, and a cascode transistor connected to a collector side of the current mirror.

* * * * *